United States Patent
Bryan et al.

[11] Patent Number: 5,272,735
[45] Date of Patent: Dec. 21, 1993

[54] SPUTTERING PROCESS BURNABLE POISON COATING

[75] Inventors: William J. Bryan, Granby; Patrick A. Perrotti, Newington, both of Conn.

[73] Assignee: Combustion Engineering, Inc., Windsor, Conn.

[21] Appl. No.: 924,731

[22] Filed: Aug. 3, 1992

[51] Int. Cl.$^5$ .................................. G21C 21/00
[52] U.S. Cl. .................................. 376/261; 376/416; 204/192.12; 204/192.15; 204/298.21
[58] Field of Search .............. 376/261, 260, 414, 415, 376/416, 417, 419, 463; 204/192.12, 192.15, 298.21; 427/5, 6, 230, 237, 238, 239

[56] References Cited

U.S. PATENT DOCUMENTS

| | | | |
|---|---|---|---|
| 4,376,025 | 3/1983 | Zega | 204/298.21 |
| 4,400,256 | 8/1983 | Riley | 204/192.15 |
| 4,407,713 | 10/1983 | Zega | 204/298.21 |
| 4,541,984 | 9/1985 | Palmer | 376/415 |
| 4,683,043 | 7/1987 | Melton et al. | 204/192.12 |

Primary Examiner—Daniel D. Wasil
Attorney, Agent, or Firm—L. James Ristas; John H. Mulholland

[57] ABSTRACT

A method for sputtering coating the inside surface of a fuel assembly tubular component (10,200,400,700) with absorber material such as a burnable poison or getter. The steps include supporting the e.g., cladding tube (10) in a fixture (12,14) and supporting a source tube (100) of e.g., burnable poison material coaxially within the cladding tube, thereby defining a cylindrical annulus (24) between the tubes. The annular space is evacuated and backfilled with an inert working gas (26) such as argon, to a pressure sufficient to sustain a plasma discharge. The cladding tube is positively biased (36) as an anode, and the source tube is negatively biased (34) as a cathode, such that a plasma of the working gas is established in the annular space. A circumferential magnetic field is generated around the source tube to confine and shape the plasma whereby the source tube is bombarded with ions from the plasma substantially uniformly over the length of the source tube. Burnable poison material is thereby sputtered substantially uniformly from the source tube onto the inside surface of the cladding tube, to form a burnable poison coating thereon.

21 Claims, 4 Drawing Sheets

SPUTTERING PROCESS BURNABLE POISON COATING

BACKGROUND OF THE INVENTION

The present invention relates to nuclear fuel assemblies, and more particularly, to applying absorptive coatings on fuel assembly components.

For many years it has been common practice to include in the core of light water nuclear reactors, neutron-absorbing material distributed non-homogeneously among the fuel assemblies, to shape the distribution of power generated in the core. More particularly, so-called "burnable poison" is typically in the form of dedicated rods distributed throughout some or all of the fuel assemblies, containing a quantity of boron, for example in the form of $B_4C$, which is highly effective in absorbing neutrons when initially placed in the core, but which diminishes in absorptive effect during one or more burnup cycles such that the effect eventually becomes essentially zero.

One disadvantage of such conventional burnable poison rods, is that each burnable poison rod replaces a nuclear fuel rod in the assembly, thereby diminishing the total power and total energy that can be extracted from the core during a particular burnup cycle. This disadvantage is more than counter-balanced by the effectiveness of the burnable poison rods in the localized shaping of the power so as to avoid high peak to average power ratios in particular fuel rods. U.S. Pat. No. 3,799,839 provides a general description of the use of burnable poisons in nuclear fuel assemblies. The power shaping permits the core to operate at its gross rated power early in the burnup cycle, but with some sacrifice as to total burnup cycle energy extraction.

In recognition of this significant disadvantage, efforts have been made to incorporate burnable poison material within the fuel rod itself, thereby avoiding the placement of dedicated burnable poison rods in the fuel assembly. U.S. Pat. No. 4,541,984 describes a method for providing burnable poison, getter, and lubricant coatings on the inside of nuclear fuel rods. U.S. Pat. No. 4,824,634 describes the application of a zirconium diboride in natural or enriched form with acrylic polymer binder on the inside of fuel rods. U.S. Pat. No. 4,880,597 describes nickel-thallium-boron electroless plating on the inside of fuel rods. U.S. Pat. No. 4,990,303 discloses enriched boron-10 and glass deposited on the inside of fuel rods using the sol-gel process. It is well known that, in addition to boron, gadolinium and erbium also have properties that are desirable for use as burnable poison material.

It can thus be appreciated that significant effort has been dedicated to developing and perfecting techniques for applying burnable poison material to the inside surface of nuclear fuel rod cladding tubes. These tubes, which are typically on the order of 0.375 inch ID, present formidable difficulties due not only to the small diameter, but also to the typical length of at least about 12 ft. Providing a uniform coating on the inside surface over substantially the full length of such tubes, without wasting expensive coating material or producing areas of excessive thickness which would interfere with the stacking of fuel rod pellets within the cladding, has presented practical difficulties as well as formidable costs.

SUMMARY OF THE INVENTION

The present invention is directed to an improved nuclear fuel assembly tubular component with a burnable poison or other absorptive internal coating that can maintain its integrity during operation.

The coating can be metal, glass, or ceramic that is sputtered onto to the inside surface of the tube. The coating is applied so that it bonds to the zircaloy surface of the tube and is chosen to have a thermal expansion co-efficient similar to the zircaloy tubing to enhance adhesion to the surface.

For coating the inside of a fuel rod cladding tube with burnable poison, the required thickness of the coating is dependent on the concentration of the burnable poison. For example, when natural boron is sputtered onto the surface of a tube having a 0.375 inch ID, a coating thickness of about 0.0002 inch is needed. The coating can be thinner if a burnable poison having enriched boron is used. Also, the thickness would vary depending on how many fuel rods were to be coated.

Although sputtering processes for applying coatings have been in general use for many years, sputtering has not previously been considered suitable for applying coatings to the internal surfaces of tubular components of nuclear fuel assemblies. This may be due in part to the very small inside diameter of the fuel rods, and the difficult, if not impossible, task of adapting sputtering processes to depositing coatings on the inside of tubular members.

These problems have been overcome in accordance with the present invention, by the use of a magnatron enhanced plasma sputtering technique, in which a uniform coating can be applied on the inside tube surface, as a result of establishing a circumferential magnetic field to confine and shape the plasma.

The present invention is also directed to a method for sputter coating the inside surface of a fuel assembly tubular component with absorber material such as a burnable poison or getter. The steps include supporting the e.g., cladding tube in a fixture and supporting a source tube of e.g., burnable poison material coaxially within the cladding tube, thereby defining a cylindrical annulus between the tubes. The annular space is evacuated and backfilled with an inert working gas such as argon, to a pressure sufficient to sustain a plasma discharge. The cladding tube is positively biased as an anode, and the source tube is negatively biased as a cathode, such that a plasma of the working gas is established in the annular space. A circumferential magnetic field is generated around the source tube to confine and shape the plasma whereby the source tube is bombarded with ions from the plasma substantially uniformly over the length of the source tube. Burnable poison material is thereby sputtered substantially uniformly from the source tube onto the inside surface of the cladding tube, to form a burnable poison coating thereon.

The process is similar for sputtering a so-called "getter" material, which absorbs atoms that can attack the integrity of the zircaloy or the fuel pellets within the cladding. One such material is yttrium, which could be coated on the inside surface of a nuclear fuel rod cladding tube, instead of, or in combination with, a burnable poison coating.

The coating of "getter" material and burnable poisons can also be limited to partial lengths within the rod. This is accomplished by shortening the length of the source tube. In this way the burnable poison can be adjusted over the length of the rod, thereby further shaping the power to avoid peaks and increasing the poison's effectiveness. The "getter" material can be limited to areas where the burnable poisons are not needed such as the ends; i.e., plenum region. In this way the additional thickness of the "getter" would not effect fuel pellet to fuel rod clad clearance.

Moreover, in some instances it may be desirable to provide burnable poison or other absorber material on the inside surface of tubular components other than nuclear fuel rods, e.g., dedicated burnable poison rods or the inside surface of control rod guide tubes. All of these components have a very high length to diameter ratio, and would be difficult if not impossible to coat with precision using sputtering processes other than as described in the present specification.

In the preferred embodiment, the invention is directed to a method for coating the inside surface of a tubular component of a nuclear fuel assembly with an absorber material, by the so-called Linear Magnatron Sputtering process. In this process, available from Surface Solutions, Inc., Boulder, Colo., the plasma between the source tube and the substrate (e.g., fuel cladding) tube is confined and shaped by a circumferential magnetic field around the source tube. A major advantage of this technique, is that it allows uniform high-rate sputtering radially outward from the surface of drawn, extruded, or cast tubing stock used as the source material. The circumferential magnetic field is generated by running high currents axially through a cooled copper tube centered within the source tube. This plasma shaping effects a constant plasma thickness that is uniformly excited over the whole length of the source tube. This is achieved because there is a plasma drift current, running in the plasma surrounding the source tube, parallel to the axis of the source tube. Other magnatron sputtering systems require that the drift current run in a closed loop. External magnets are not required for establishing the magnetic shaping field.

In the Linear Magnatron Sputtering System, the drift current may be boosted to a very high level at an initiating end, allowing the use of relatively simple tubular source cathodes. In addition to achieving higher sputtering rates, the sputtered material can also arrive at the substrate surface having higher impingement energy. Both the sputtering rate and the energy of the impingement can be independently controlled. Since the inside surfaces of the tubes can be coated in a static mode, the requirement for either moving or rotating the substrate during processing is largely reduced. This enables the use of a much simpler vacuum system, with longer processing periods between maintenance, less time required for maintenance activities, and fewer non-scheduled maintenance interrupts.

BRIEF DESCRIPTION OF THE DRAWINGS

These and other objects and advantages of the invention will be described below with reference to the accompanying figures, in which.

DESCRIPTION OF THE PREFERRED EMBODIMENT

Figure 1:
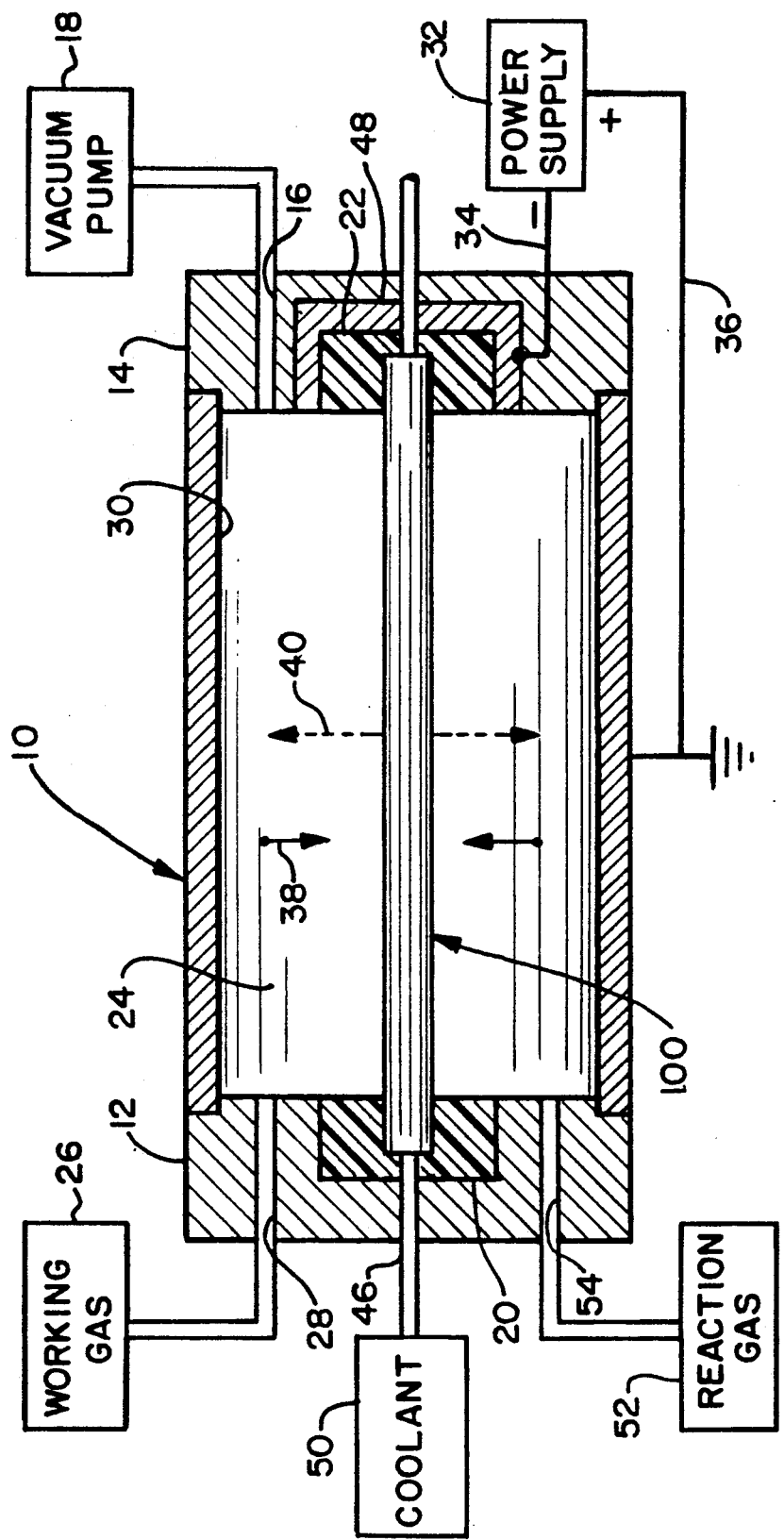
FIG. 1 is a schematic view of a cladding tube as fixtured during the coating process.
Figure 2:
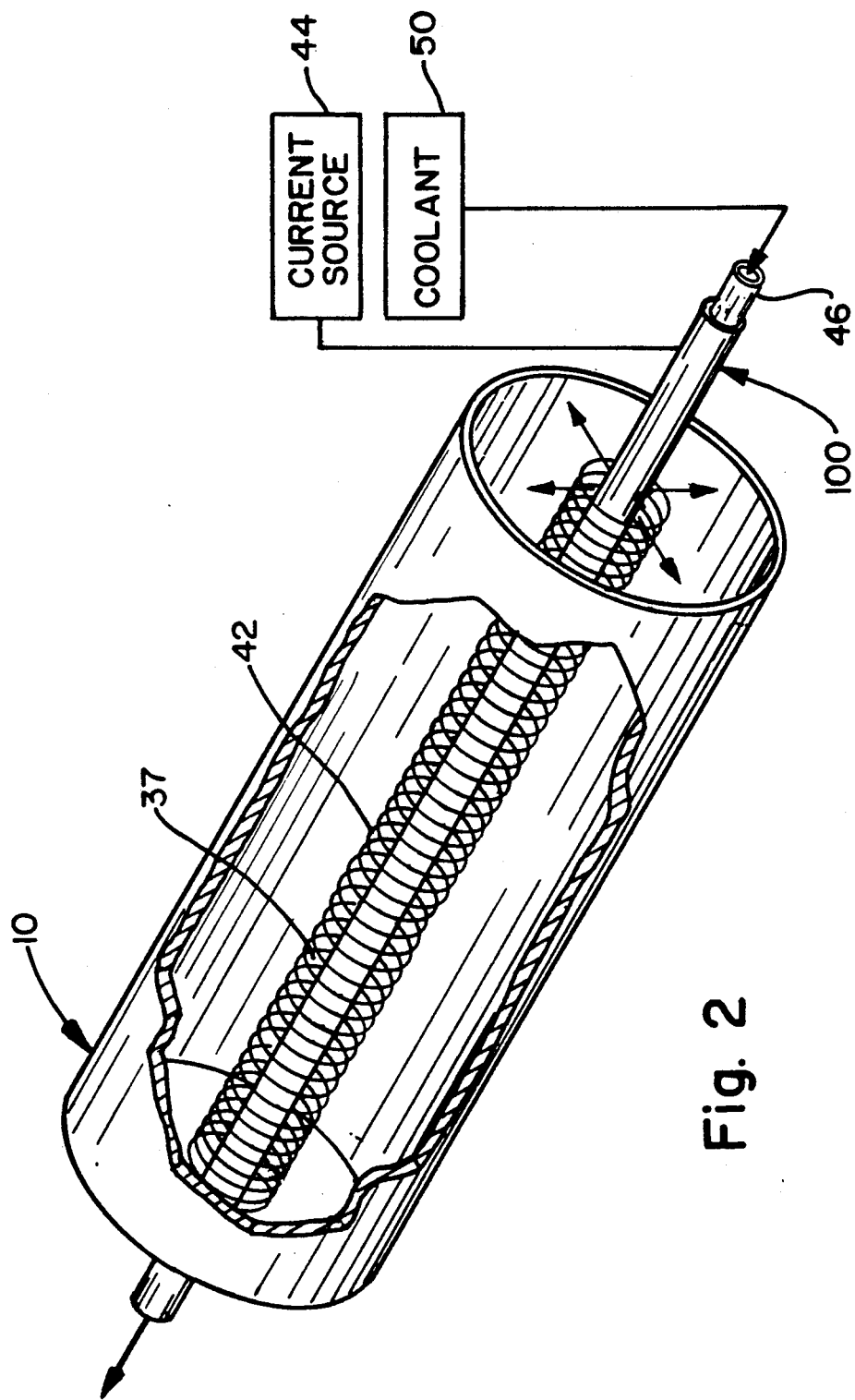
FIG. 2 is a schematic illustration showing certain details of the process represented by FIG. 1.

FIGS. 1 and 2 are schematic representations of the use of the so-called Linear Magnatron Sputtering technique, available from Surface Solutions, Inc., as adapted for implementing the present invention. In the preferred embodiment, a nuclear fuel rod cladding tube, 10 made from zircaloy, is coated substantially uniformly along the entire inside surface, over substantially the full length of the rod (e.g., at least ten feet along a tube that is at least about twelve feet long). For illustrative purposes, the aspect ratio of the cladding tube 10 as shown in the Figures, has been substantially shortened relative to the typical tube dimensions of 0.375 inch ID and a length in excess of 10 ft.

The cladding tube 10 is fixtured such that first and second end plugs 12, 14 seal the tube interior. One end plug 14 has a vacuum port 16 through which a vacuum pump 18 can evacuate the content of the tube. The working gas port 28 may be situated in either end plug. Each end plug includes means, such as first and second mounts 20,22, for supporting a burnable poison material source tube 100 having a smaller outer diameter than the inner diameter of the cladding tube, coaxially within the cladding tube, thereby defining a cylindrical annulus 24 between the tubes. After evacuation, an inert working gas such as argon from source 26 is backfilled in the annular 24 to a pressure sufficient to sustain a plasma discharge.

The source tube 100 in the normal implementation of the present invention, would be a homogeneous tube of the material which is desired to be coated on the inside surface, or substrate 30, of the cladding tube 10. In the preferred embodiment, wherein a burnable poison material is to be coated on the substrate, the source tube would be natural boron, or boron enriched with the boron-10 isotope, which is the isotope most effective in absorbing thermal neutrons. The source tube 100 is preferably at least the same length as the cladding tube 10.

A power supply 32 with negative lead 34 is connected through the connector mount or otherwise, to the source tube 100, and the positive lead 36 is connected to the substrate 30, such that the source tube serves as a cathode and the substrate serves as an anode. A plasma 37 consisting of positive argon ions and electrons is established in the annular space 24, with the positive ions 38 bombarding the cathode 100 with sufficient energy to vaporize surface atoms from the source tube 100 onto the substrate 30. Because the source material is passed into the vapor phase 40 by a mechanical process (momentum exchange) rather than a chemical or thermal process, virtually any material is a candidate for coating. Thus metals, glasses and other ceramics having desirable absorptive properties can be utilized.

The plasma in the annular space can be established by any known means, such as direct current discharges when sputtering metals, but in order to improve the efficiency, magnatron techniques are applied to confine and shape the plasma. In the Linear Magnatron Sputtering technique available from Surface Solutions, Inc. a circumferential magnetic field 42 is established around the source tube 100 by running high currents from current source 44 axially through a copper tube 46 centered within the source tube and cooled by coolant 50, as shown in FIG. 2. This achieves a uniform rate of material evaporation along the length of the source tube 100, because of a constant plasma thickness that is uniformly excited over the whole length of the source tube. This results from the plasma drift current in the plasma surrounding the source tube, running in a direction parallel to the axis of the source tube 100. This is far superior to cylindrical post sputtering schemes, which require that the drift current run in a closed loop. In the Linear Magnatron Sputtering System of the present invention, the drift current may be boosted with an enhancer device shown generally at 48, to a very high level at one end of the source tube.

It should thus be appreciate that to the extent a plasma of constant thickness can be maintained in uniform excitation over the full length of the source tube 100, the radially projecting source atoms 40 will coat the full surface 30 of the cladding tube substantially uniformly. It should also be appreciated that in the embodiment described in FIG. 1, the cladding tube 10 itself serves as the boundary of the evacuation chamber 24. An alternative embodiment would encapsulate the cladding tube 10 within an outer vacuum chamber (not shown), in which case the fixturing and end plug arrangements would have analogous counterparts in the walls of the vacuum chamber.

Once initiated, the flux of sputtered material leaving the source tube 100 will continue until a substantially uniform coating of, for example, a thickness of 0.0002 inch is achieved, whereupon the process is stopped, the end plugs removed, and the next tube fixtured for restarting the coating process.

Figure 3:
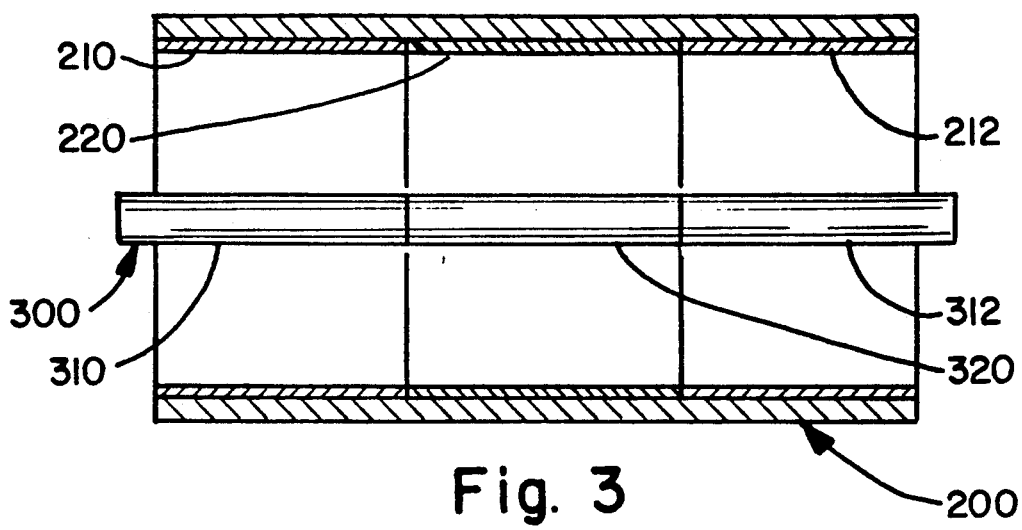
FIG. 3 is a schematic of the substrate cladding tube with a source tube of material non-uniformly distributed so as to produce a non-uniform coating on the inside of the substrate tube.
Figure 4A:
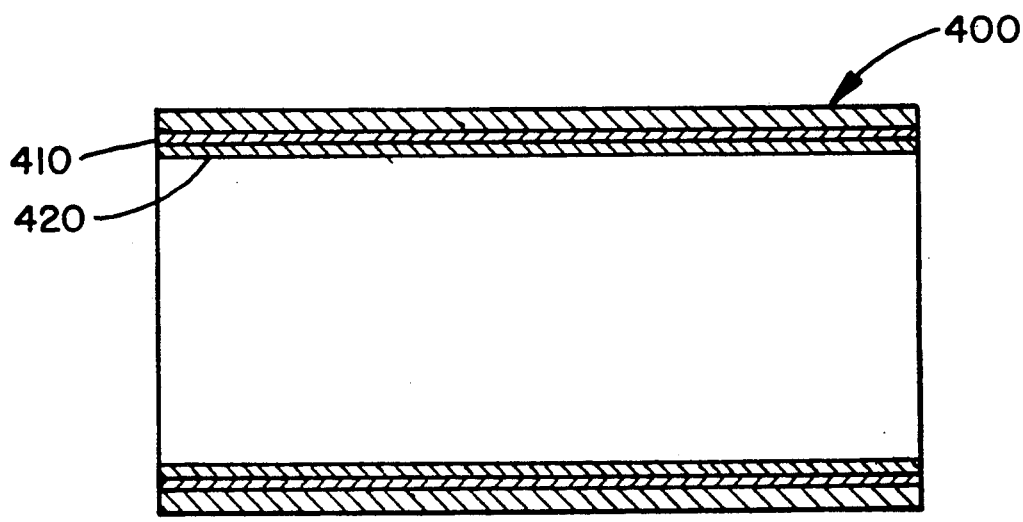
FIGS. 4a, 4b, and 4c together show a schematic representation of a coated tube having two sequentially applied coatings, and also illustrating that two distinct material source tubes were used to apply those two coatings.
Figure 4B:
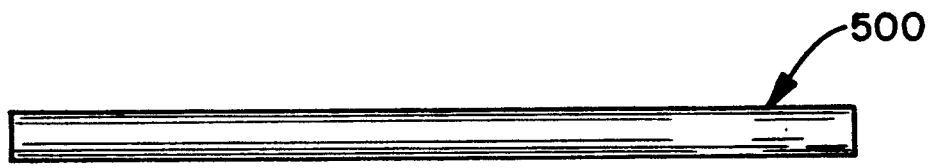
Figure 4C:
Figure 5A:
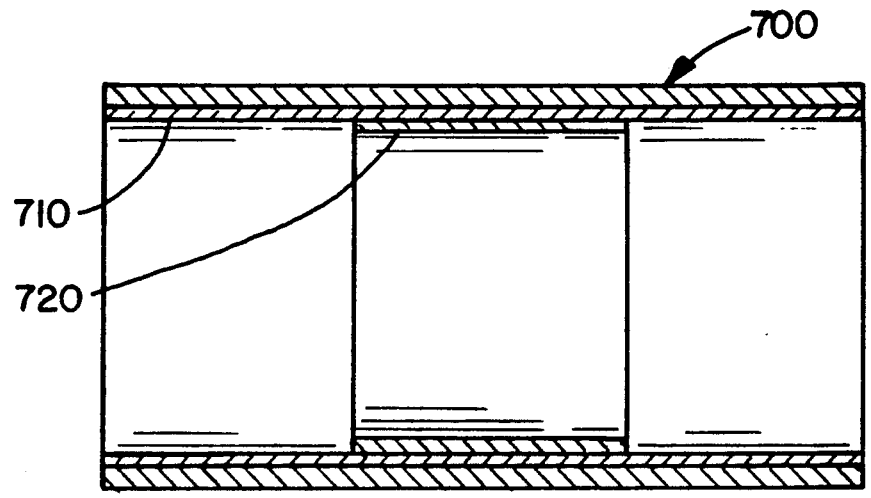
FIGS. 5a, 5b, and 5c together show a schematic representation of yet another embodiment wherein a first coating has been applied to the inside surface over the full length of the substrate tube, a second coating has been applied only over a portion of the length of the tube, and wherein the respective first source tube has a uniform material composition corresponding to the full length of the substrate tube, and the material to be sputtered from the second source tube spans only a portion of the total length of the substrate tube.
Figure 5B:
Figure 5C:

FIGS. 3 through 5 show alternative embodiments of the process, and the coated tubes resulting from such processes. In FIG. 3, the cladding or guide tube 200 has a non uniform but prescribed distribution of coating material, as a result of a commensurate non uniform, but prescribed distribution of material on source tube 300. In particular, in a three region distribution of coatings, regions 210 and 212 at the respective left and right sides of tube 200, are of the same absorptive material. The middle region 220, is of a different absorptive material. It can be appreciated that this distribution of coating material results from the source tube 300 having similar material in regions 310 and 312 (which span the same axial length as the respective regions 210 and 212, and a central region 320 spanning the same axial length as coating region 220.

This embodiment would be particularly useful where the boron 10 enrichment at the central region 220 of the tube 200 is desirably higher than the enrichment of boron at the remote regions 210, 212. It should be appreciated that this distribution of material on the tube 200, can be accomplished by the use of only a single source tube 300 which need not be repositioned during the course of coating the entire inner surface of tube 200.

FIG. 4 represents another embodiment, wherein tube 400 has a first interior coating 410 which covers the entire inside surface of tube 400, and a second coating 420 of different absorptive material, which completely covers the first coating 410. In this embodiment, one coating could be a neutron absorbing material acting as a burnable poison, whereas the other coating could be a getter material for absorbing hydrogen atoms. In this embodiment, two different source tubes 500, for coating material 410, and 600, for coating material 420, would be used sequentially in the overall process arrangement shown in FIGS. 1 and 2.

FIG. 5 illustrates yet another embodiment which is, in essence, a variation of the embodiment of FIG. 3, in which the coating on the substrate tube 700 is axially nonuniform, or limited. In this embodiment, a first coating 710 from source tube 800, is applied uniformly on the entire substrate surface of tube 700. The source tube 800 is removed and a second coating 720 from source tube 900 is applied, resulting in the axially central portion of tube 700, having two coatings. Thus, the coating can be limited to partial lengths within the rod by shortening the length of source tube.

As mentioned above, the process according to the present invention is amenable to the sputter coating of a wide variety of potentially useful absorbers. Some of these absorbers cannot readily be sputtered from a homogeneous source tube, but rather can be formed either chemically in the inert gas via chemical reaction, or at the surface internal surface of the cladding tube. The coatings are thus applied by analogy to reactive chemical deposition processes. A source 52 of reaction gas and associated plug port 54 are shown in FIG. 1 for this purpose.

Table 1 lists a variety of burnable poison metals that can be sputtered in accordance with the present invention:

TABLE 1

| Burnable Poison Metals and Metallic Compounds |
|---|
| Gadolinium |
| Erbium |
| Boron |
| $ZrB_2$ |
| BN |
| $TiB_2$ |

Table 2 is a representative list of burnable poison ceramic materials including glasses that are usable with the present invention:

TABLE 2

| Burnable Poison Ceramics and Glasses |
|---|
| 20 $Li_2$ 080$B_3$ |
| 15 $Na_2$ 085B 20 |
| $B_4C$ |

Table 3 is a representative list of getter material that can be sputtered in accordance with the present invention:

TABLE 3

| Getter Material |
|---|
| Yttrium |
| Zirconium-Nickel alloys |
| Zirconium-Titanium-Nickel alloys |

BN is a burnable poison coating that can be formed with the use of nitrogen as the reaction gas introduced via reaction gas source 52 and port 54, as shown in FIG. 1.

I claim:

1. A method for coating the inside surface of a nuclear fuel assembly tubular component with an absorptive material, comprising:

supporting the component tube in a fixture;

supporting a source tube of absorptive material coaxially within the component tube, thereby defining a cylindrical annular space between the tubes;

evacuating the annular space and backfilling the annular space with an inert working gas to a pressure sufficient to sustain a plasma discharge;

connecting a power supply to the component tube with a positive bias as an anode and to the source tube with a negative bias as a cathode, such that a plasma of the working gas is established in the annular space;

establishing a circumferential magnetic field around the source tube to confine and shape the plasma;

whereby the source tube is bombarded with ions from the plasma and absorptive material is thereby sputtered from the source tube onto the inside surface of the component tube to form a coating thereon.

2. The method of claim 1, wherein the component tube has a length of at least about 12 ft and the source tube spans the length of the cladding tube; and the absorptive material is sputtered along at least about 10 ft of the length of the component tube simultaneously.

3. The method of claim 2, wherein the source tube has a prescribed non-homogenous distribution of absorptive material along its length, and the absorptive material is sputtered simultaneously onto the component tube in a prescribed, non-homogeneous distribution along its length.

4. The method of claim 3, wherein the non-homogeneous distribution on the source tube includes at least two regions of the source tube surface having a respective two different materials selected from the group consisting of gadolinium-bearing material, erbium-bearing material, and boron-bearing material.

5. The method of claim 1, wherein a first burnable poison absorptive material from a first source tube is sputtered onto the component tube, to form a first coating;

the first coating is then positioned coaxially around a second source tube of a second burnable poison absorptive material, and the second material is sputtered onto the first coating to form a second coating.

6. The method of claim 1, wherein a first burnable absorptive poison material from a first source tube is sputtered onto a first longitudinal portion of the component tube to form a first coating; and a second burnable poison absorptive material from a second source tube is sputtered onto a second longitudinal portion of the component tube to form a second coating.

7. The method of 1, wherein the step of backfilling includes backfilling with a reactant gas which in the presence of the plasma and the sputtered absorptive material, chemically reacts with the sputtered material to form a coating on the component tube.

8. A method for coating the inside surface of a zircaloy fuel rod cladding tube with burnable poison material, comprising:

supporting the cladding tube in a fixture;

supporting a source tube of burnable poison material coaxially within the cladding tube, thereby defining a cylindrical annular space between the tubes;

evacuating the annular space and backfilling the annular space with an inert working gas to a pressure sufficient to sustain a plasma discharge;

connecting a power supply to the cladding tube with a positive bias as an anode and to the source tube with a negative bias as a cathode, such that a plasma of the working gas is established in the annular space;

establishing a circumferential magnetic field around the source tube to confine and shape the plasma;

whereby the source tube is bombarded with ions from the plasma and burnable poison material is thereby sputtered from the source tube onto the inside surface of the cladding tube to form a burnable poison coating thereon.

9. The method of claim 8, wherein the cladding tube has a length of at least about 12 ft and the source tube spans the length of the cladding tube; and the burnable poison material is sputtered along at least about 10 ft of the length of the cladding tube simultaneously.

10. The method of claim 8, wherein the burnable poison is in metallic form.

11. The method of claim 8, wherein the burnable poison is in ceramic form.

12. The method of claim 10, wherein the burnable poison material includes the elemental isotope boron-10.

13. The method of claim 10, wherein the burnable poison material is natural boron.

14. The method of claim 11, wherein the burnable poison material is zirconium diboride enriched with boron-10.

15. The method of claim 9, wherein the source tube has a prescribed non-homogenous distribution of burnable poison material along its length, and the burnable poison is sputtered simultaneously onto the cladding tube in a prescribed, non-homogeneous distribution along its length.

16. The method of claim 15, wherein the non-homogeneous distribution on the source tube includes at least two regions of the source tube surface having a respective two different materials selected from the group consisting of gadolinium-bearing material, erbium-bearing material, and boron-bearing material.

17. The method of claim 8, wherein a first burnable poison material from a first source tube is sputtered onto the cladding tube, to form a first coating;

the first coating is then positioned coaxially around a second source tube of a second burnable poison material, and the second material is sputtered onto the first coating to form a second coating.

18. The method of claim 8, wherein a first burnable poison material from a first source tube is sputtered onto a first longitudinal portion of the cladding tube to form a first coating; and a second burnable poison material from a second source tube is sputtered onto a second longitudinal portion of the cladding tube to form a second coating.

19. The method of claim 8, wherein
the burnable poison material is sputtered over a limited axial portion of the cladding tube.

20. A method for coating the inside surface of a zircaloy fuel rod cladding tube with getter material, comprising:
supporting the cladding tube in a fixture;
supporting a source tube of getter material coaxially within the cladding tube, thereby defining a cylindrical annular shape between the tubes;
evacuating the annular space and backfilling the annular space with an inert working gas to a pressure sufficient to sustain a plasma discharge;
connecting a power supply to the cladding tube with a positive bias as an anode and to the source tube with a negative bias as a cathode, such that a plasma of the working gas is established in the annular space;
establishing a circumferential magnetic field around the source tube to confine and shape the plasma;
whereby the source tube is bombarded with ions from the plasma and getter material is thereby sputtered from the source tube onto the inside surface of the cladding tube to form a getter material coating thereon.

21. The method of claim 20, wherein the getter material is sputtered over a limited axial portion of the cladding tube.

* * * * *

UNITED STATES PATENT AND TRADEMARK OFFICE
CERTIFICATE OF CORRECTION

PATENT NO. : 5,272,735
DATED : December 21, 1993
INVENTOR(S) : William J. Bryan and Patrick A. Perrotti It is certified that error appears in the above-indentified patent and that said Letters Patent is hereby corrected as shown below:

Column 9, last line, "shape" should be --space--.

Signed and Sealed this

Thirty-first Day of December, 1996

Attest:

BRUCE LEHMAN

*Attesting Officer*  *Commissioner of Patents and Trademarks*